(12) United States Patent
Berzati et al.

(10) Patent No.: US 11,086,376 B2
(45) Date of Patent: Aug. 10, 2021

(54) METHOD OF ACTIVATING A FEATURE OF A CHIP

(71) Applicant: THALES DIS FRANCE SA, Meudon (FR)

(72) Inventors: Alexandre Berzati, Gemenos (FR); Loïc Bonizec, Gemenos (FR); Alaa Dou Nassre, Gemenos (FR)

(73) Assignee: THALES DIS FRANCE SA, Meudon (FR)

(*) Notice: Subject to any disclaimer, the term of this patent is extended or adjusted under 35 U.S.C. 154(b) by 0 days.

(21) Appl. No.: 15/733,238

(22) PCT Filed: Dec. 4, 2018

(86) PCT No.: PCT/EP2018/083521
§ 371 (c)(1),
(2) Date: Jun. 15, 2020

(87) PCT Pub. No.: WO2019/120991
PCT Pub. Date: Jun. 27, 2019

(65) Prior Publication Data
US 2021/0096626 A1    Apr. 1, 2021

(30) Foreign Application Priority Data
Dec. 19, 2017   (EP) .................................... 17306821

(51) Int. Cl.
*G06F 1/28* (2006.01)
*G06F 1/12* (2006.01)
(52) U.S. Cl.
CPC ................. *G06F 1/28* (2013.01); *G06F 1/12* (2013.01)

(58) Field of Classification Search
CPC .................................... G06F 1/28; G06F 1/12
See application file for complete search history.

(56) References Cited

U.S. PATENT DOCUMENTS

| 4,306,300 A | * 12/1981 | Terman | ................... G11C 19/36 257/215 |
| 7,119,572 B2 | * 10/2006 | Malik | ..................... H04Q 9/00 326/38 |
| 7,454,556 B1 | 11/2008 | Knapp | |

(Continued)

FOREIGN PATENT DOCUMENTS

JP           58052581 A   *  3/1983   ........... G01R 31/316

OTHER PUBLICATIONS

International Search Report (PCT/ISA/210) dated Mar. 19, 2019, by the European Patent Office as the International Searching Authority for International Application No. PCT/EP2018/083521.

(Continued)

*Primary Examiner* — Zahid Choudhury
(74) *Attorney, Agent, or Firm* — Buchanan Ingersoll & Rooney PC

(57) ABSTRACT

Method for activating a feature of a chip having an interface comprising at least two power pins. The method comprises the following steps: the chip measures a series of voltage values between said power pins, the chip detects a series of sync signals different from clock signals, said sync signals being interleaved with said voltage values, the chip identifies a data sequence from said series of voltage values, and the chip activates the feature only if the data sequence matches a predefined pattern.

10 Claims, 3 Drawing Sheets

```
Detecting a series of sync signals different
from clock signals and measuring a series of
voltage values between two power pins (GND, VCC)    ⟋ S10
of the chip 10; said sync signals being
interleaved with said voltage values.
```

```
Identifying a data sequence from said series of     ⟋ S20
voltage values.
```

```
Activating the feature only if the data sequence    ⟋ S30
matches a predefined pattern.
```

(56) References Cited

U.S. PATENT DOCUMENTS

2009/0327664 A1\* 12/2009 Yoshimi ................ G06F 21/755
                                                                            712/221
2010/0042874 A1\*  2/2010 Lee ..................... G06F 11/2221
                                                                             714/27

OTHER PUBLICATIONS

Written Opinion (PCT/ISA/237) dated Mar. 19, 2019, by the European Patent Office as the International Searching Authority for International Application No. PCT/EP2018/083521.

\* cited by examiner

METHOD OF ACTIVATING A FEATURE OF A CHIP

FIELD OF THE INVENTION

The present invention relates to methods of activating a feature of a chip. It relates particularly to methods of activating a feature by an entity external to the chip.

BACKGROUND OF THE INVENTION

Chips and microchips use various communication protocols depending on the system where they are embedded (e.g. I2C, SPI, USB, UART, ISO 7816-3 T=0/T=1). The chip assembly is linked to the target communication protocol (s) (e.g. I2C requires two wires, SPI requires four wires.) supported by the final product. For each final product, only the target communication protocols are available for the operations after issuance of the product. Since a wide variety of protocol settings may be encountered on the final products, it is difficult or even not possible to access all the chips through a common communication protocol.

There is a need for specifying and implementing a new communication protocol which may apply to all kinds of chip.

SUMMARY OF THE INVENTION

The invention aims at solving the above mentioned technical problem.

An object of the present invention is a method for activating a feature of a chip which has an interface comprising at least two power pins. The method comprises the following steps:
- the chip measures a series of voltage values between said power pins,
- the chip detects a series of sync signals different from clock signals, said sync signals being interleaved with said voltage values,
- the chip identifies a data sequence from said series of voltage values, and
- the chip activates the feature only if the data sequence matches a predefined pattern.

Advantageously, the interface may comprise a Reset pin (RST) and each of said sync signals may be an activation of the Reset pin.

Advantageously, each of said sync signals may be implemented by a predefined difference between said power pins.

Advantageously, the feature may be a communication protocol or a functioning mode of the chip.

Advantageously, each voltage value of the series may correspond to a voltage level defined by ISO/IEC7816-3 classes of operating conditions.

Another object of the invention is a chip having an interface comprising at least two power pins. The chip is configured to measure a series of voltage values between said power pins. The chip is configured to detect a series of sync signals different from clock signals, said sync signals being interleaved with said voltage values. The chip is configured to identify a data sequence from said series of voltage values. The chip is configured to activate a feature only if the data sequence matches a predefined pattern.

Advantageously, the interface may comprise a Reset pin and the chip may be configured to interpret an activation of the Reset pin as a sync signal.

Advantageously, the chip may be configured to interpret a predefined difference between said power pins as a sync signal.

Advantageously, the feature may be a communication protocol or a functioning mode of the chip.

Advantageously, the chip may be configured to identify said data sequence from said series of voltage values by comparing each voltage value of said series to voltage levels defined by ISO/IEC7816-3 classes of operating conditions.

BRIEF DESCRIPTION OF THE DRAWINGS

Other characteristics and advantages of the present invention will emerge more clearly from a reading of the following description of a number of preferred embodiments of the invention with reference to the corresponding accompanying drawings in which.

DETAILED DESCRIPTION OF THE PREFERRED EMBODIMENTS

The invention may apply to any types of chip comprising at least two power pins.

Figure 4:
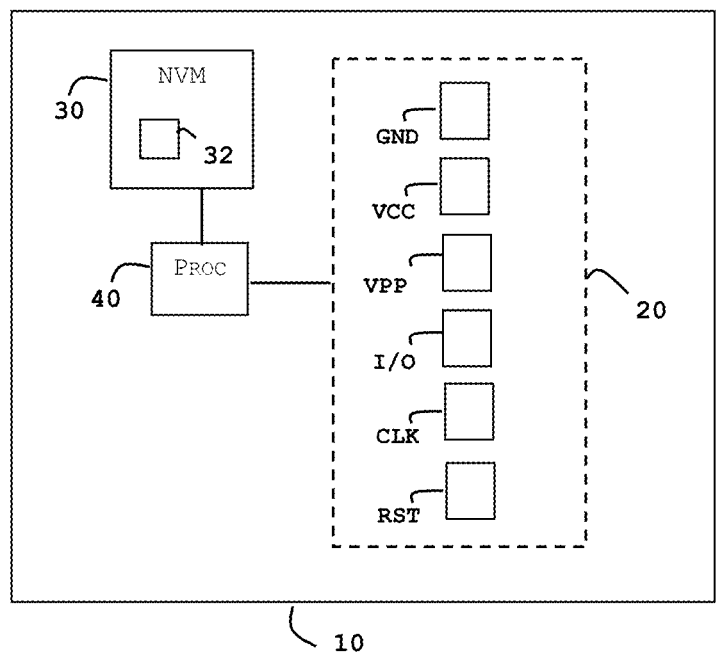
FIG. 4 depicts schematically an example of architecture of a chip according to an embodiment of the invention.

FIG. 4 shows schematically an example of architecture of a chip according to an embodiment of the invention.

In this example, the chip 10 is a smart card chip comprising a non-volatile memory 30, a processor 40 and a communication interface 20.

The communication interface 20 includes six pads (also called pins) GND (ground, Reference voltage), VCC (power supply input), I/O (input and output for serial data), CLK (clock signal input), RST (Reset signal input) and VPP (programming power input).

The chip 10 comprises an agent 32 configured to measure a series of voltage values between GND and VCC pins. The agent 32 is configured to detect a series of sync signals which are interleaved with the voltage values. It is to be noted that the sync signals are different from clock signals which may be received on the CLK pad.

The agent 32 is configured to identify a data sequence from the received series of voltage values and to activate a chip feature only if the data sequence matches a predefined pattern.

Preferably the agent is a software component stored in the non-volatile memory 30. Alternatively, the agent 32 may be implemented as a hardware component or any combination of software and hardware entities.

Figure 1:
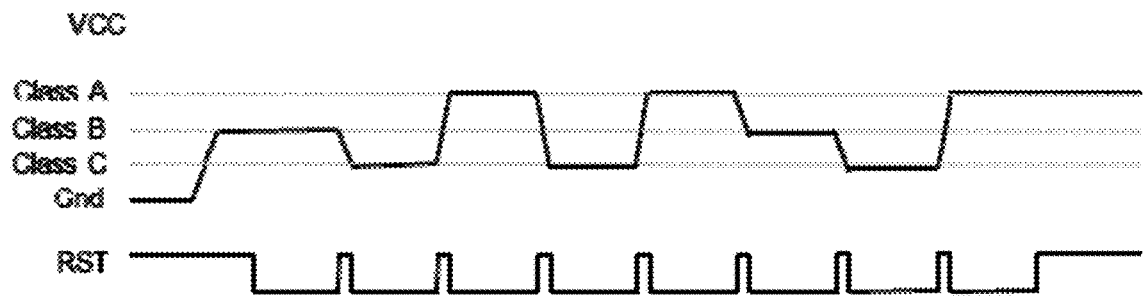
FIG. 1 depicts a first example of VCC modulation according to an embodiment of the invention.

FIG. 1 shows a first example of VCC modulation according to an embodiment of the invention.

In this example, the agent 32 spies three pins: VCC, GND and RST. The agent 32 is designed to detect the Classes of operating conditions (i.e. classes A/B/C) as defined by ISO/IEC7816-3 Third edition (2006-11-01) for example.

More precisely, the nominal supply voltage provided to the VCC pad is: 5 V for class A, 3 V for class B and 1.8 V for class C.

In this example, a signal detected on the RST pad is interpreted by the agent 32 as a sync signal. In other word an activation of the RST pin is interpreted as a sync signal. A sync signal may be generated using a Warm Reset as defined by ISO/IEC7816-3.

According to the example of FIG. 1, the agent 32 detects the following series: BCACABCA.

Then the agent 32 compares the detected series to a predefined pattern. In case of correspondence (same value), the agent activates (enables) a feature associated to the pattern. For example, the communication protocol ISO7816-3 T=0 may be enabled or the chip may be authorized to export a log of historic data. If the detected series do not match the predefined pattern, the agent does not activate the feature associated to the pattern.

The chip may store several patterns corresponding to as many features. In such a case, the agent can scan the stored patterns to perform the checking.

Alternatively, the detected series may be checked versus the predefined pattern by using a cryptographic algorithm.

Figure 2:
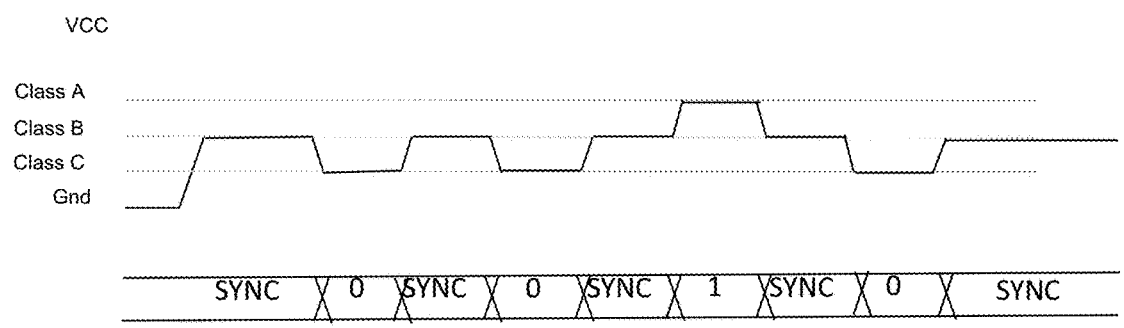
FIG. 2 depicts a second example of VCC modulation according to an embodiment of the invention.

FIG. 2 shows a second example of VCC modulation according to an embodiment of the invention.

In this example, the agent 32 spies only two pins: the VCC and the GND.

The agent 32 is designed to detect the Classes of operating conditions (i.e. classes A/B/C) as defined by ISO/IEC7816-3 Third edition (2006-11-01) for example.

In this example, a signal of Class B detected on the VCC pad is interpreted by the agent 32 as a sync signal.

According to the example of FIG. 2, the agent 32 detects the following series: 0010. Similarly to the example of FIG. 1, the agent checks the detected series versus one or several predefined patterns stored in the chip.

Figure 3:
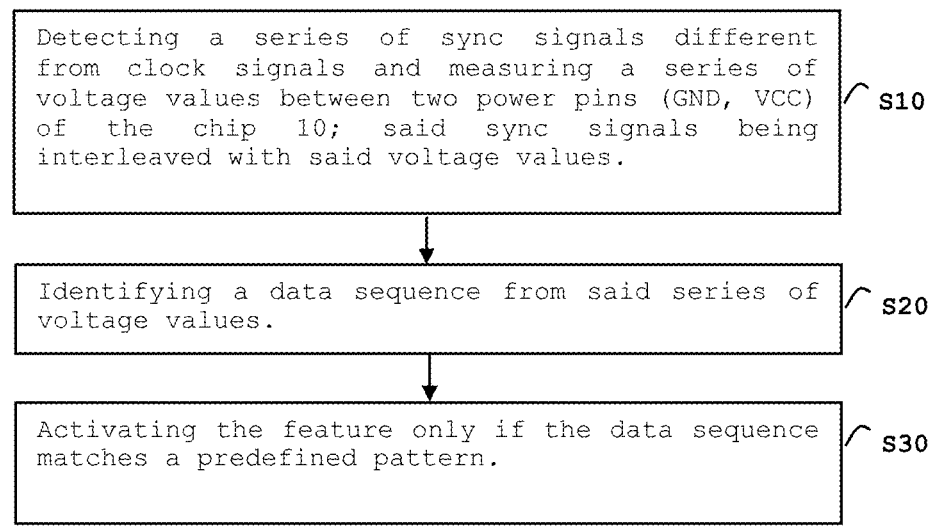
FIG. 3 shows a flow diagram for activating a feature of a chip according to an example of the invention.

FIG. 3 shows a flow diagram for activating a feature of a chip according to an example of the invention.

At step S10, the agent 32 detects a series of sync signals different from clock signals and measures a series of voltage values between two power pins of the chip 10. The sync signals are interleaved with the voltage values.

The agent 32 is configured to use the sync signals for identifying each voltage value of the series of voltage values.

The agent 32 may be implemented as an analog/digital converter which interprets five predefined differences between the two spied power pins as respectively a sync signal, a first data and a second data. Thus the power levels encoding said first and second data may be different from the power levels defined for the classes A/B/C.

The agent 32 may be precise enough to interpret more than three predefined levels and thus allow higher bandwidth (3 levels lead to 1 bit information plus 1 bit sync per voltage value, 5 levels lead to 2 bits information plus 1 bit sync per voltage value).

At step S20, the agent 32 identifies a data sequence from the detected series of voltage values.

At step S30, the agent 32 activates the feature only if the identified data sequence matches a predefined pattern. For instance, the activated feature may be a Test mode or a predefined/additional function. A dedicated VCC encoded secret value can be defined for each feature to be activated on the chip.

Figure 5:
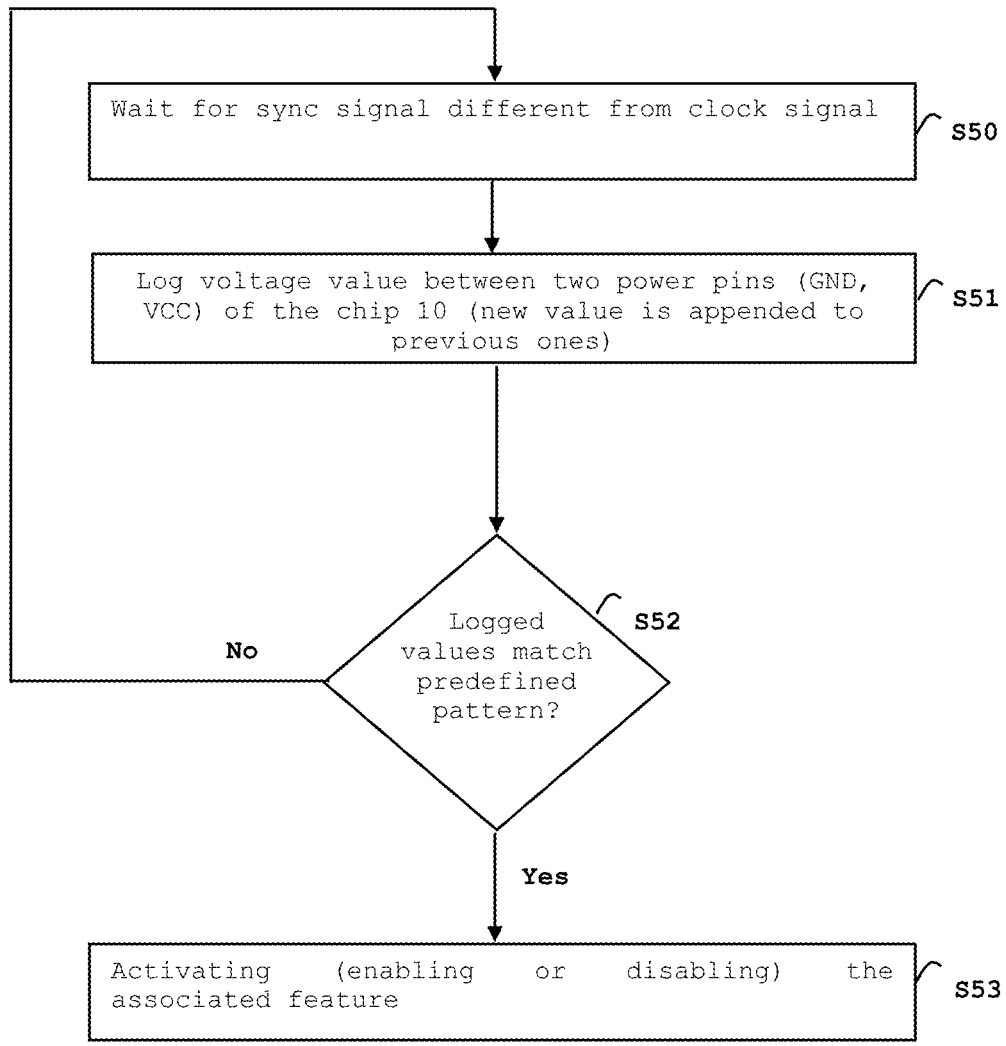
FIG. 5 depicts schematically an example of flow diagram for managing data received according to the invention.

FIG. 5 shows schematically an example of flow diagram for managing data received according to the invention.

The agent 32 loops each time a data sequence does not match any predefined pattern. For each loop, the agent 32 logs (S51) the measured value in a log buffer storing previous measured values and compares (S52) the log buffer to the predefined pattern(s). If the comparison failed, there is no activation else it activates (S53) the associated feature. Hence the length of the predefined pattern may easily adjusted to the needs. For instance a 16 bits-pattern may be defined for a feature having a low-security level while a 64 bits-pattern may be defined for a feature requiring high security level. Thanks to this embodiment, the invention allows to manage patterns having different sizes.

In this embodiment, the system comes back to the beginning of the loop only if a sync signal occurs. If no other sync signal is detected, the system continues the usual execution. For instance, the chip may complete a full boot sequence and becomes available for applicative services. Thus thanks to this embodiment it possible to retrieve a data sequence opportunistically without permanently blocking the communication interface. The waiting step (S50) is not a blocking point since the chip may continue its usual running even if no sync signal is detected.

Preferably, the log buffer is stored in RAM and its content remains available during a short duration. After a predetermined time, the log buffer is erased so as to avoid unwanted use of the invention.

It is to be noted that the activation (in the meaning of the invention) of a feature may be the disabling (i.e. locking) of a function. Hence a predefined pattern may be set for the disabling of a target communication protocol. In such a case, if an identified data sequence matches the predefined pattern, the agent will disabled the target communication protocol in the chip. Thanks to the invention a generic chip may be customized for a specific domain like banking or automotive by enabling/disabling functions.

The length of the predefined pattern may be long enough to defeat any attempts to enable a sensitive feature.

Thanks to the invention, the chip may be switched in a mode allowing to retrieve tracked data for analysis. This may be useful for analyzing usage of a chip on the field or when a failure occurred. (Field return analysis)

The invention allows to diversify the features enabled for a plurality of chips belonging to a unique production batch. Hence some of these chips may be adapted for a specific use while other can remain unchanged.

The invention may be used to change settings of a chip whatever its package and selected communication protocol(s).

The invention allows parallel communication with multiple chips whatever the corners/process drifts. In addition, the invention provides a cost effective solution for parallel "self-test" activation during chip probing with only two points.

The invention is easy to implement and requires minor adaptations on reader side.

It is to be noted that several patterns (having different lengths) may be defined and associated with as many features. Thanks to the invention, each of these feature can be individually activated.

An advantage of the invention is to be independent of the underlying technology used for the design of the chip. It may apply to a wide range of chip.

It must be understood, within the scope of the invention, that the above-described embodiments are provided as non-limitative examples. The invention is not limited to the described embodiments or examples. In particular, the invention is not limited to smart card chip and applies to any chips having at least two power pins. It is to be noted that the features described in the presented embodiments and examples may be combined.

The invention claimed is:

1. A method of activating a feature of a chip having an interface comprising at least two power pins (GND, VCC), wherein said method comprises the following steps:
the chip measures a series of voltage values between said power pins,
the chip detects a series of sync signals different from clock signals, said sync signals being interleaved with said voltage values,
the chip identifies a data sequence from said series of voltage values, and
the chip activates the feature only if the data sequence matches a predefined pattern.

2. The method according to claim 1, wherein the interface comprises a Reset pin and wherein each of said sync signals is an activation of the Reset pin.

3. The method according to claim 1, wherein each of said sync signals is implemented by a predefined difference between said power pins.

4. The method according to claim 1, wherein the feature is a communication protocol or a functioning mode of the chip.

5. The method according to claim 1, wherein said voltage values of said series corresponds to voltage levels defined by ISO/IEC7816-3 classes of operating conditions.

6. A chip having an interface comprising at least two power pins, wherein:
the chip is configured to measure a series of voltage values between said power pins,
the chip is configured to detect a series of sync signals different from clock signals, said sync signals being interleaved with said voltage values,
the chip is configured to identify a data sequence from said series of voltage values, and
the chip is configured to activate a feature only if the data sequence matches a predefined pattern.

7. The chip according to claim 6, wherein said interface comprises a Reset pin and wherein the chip is configured to interpret an activation of the Reset pin as a sync signal.

8. The chip according to claim 6, wherein the chip is configured to interpret a predefined difference between said power pins as a sync signal.

9. The chip according to claim 6, wherein the feature is a communication protocol or a functioning mode of the chip.

10. The chip according to claim 6, wherein the chip is configured to identify said data sequence from said series of voltage values by comparing each voltage value of said series to voltage levels defined by ISO/IEC7816-3 classes of operating conditions.

* * * * *